United States Patent
Takase et al.

(10) Patent No.: US 11,096,285 B2
(45) Date of Patent: Aug. 17, 2021

(54) ELECTRONIC CIRCUIT SUBSTRATE

(71) Applicant: Hitachi Automotive Systems, Ltd., Hitachinaka (JP)

(72) Inventors: Kousuke Takase, Hitachinaka (JP); Isamu Honda, Hitachinaka (JP); Kiminori Muto, Hitachinaka (JP); Yuka Tomaru, Hitachinaka (JP)

(73) Assignee: Hitachi Automotive Systems, Ltd., Hitachinaka (JP)

( * ) Notice: Subject to any disclaimer, the term of this patent is extended or adjusted under 35 U.S.C. 154(b) by 0 days.

(21) Appl. No.: 16/619,709

(22) PCT Filed: Jun. 1, 2018

(86) PCT No.: PCT/JP2018/021133
§ 371 (c)(1),
(2) Date: Dec. 5, 2019

(87) PCT Pub. No.: WO2019/012849
PCT Pub. Date: Jan. 17, 2019

(65) Prior Publication Data
US 2020/0205290 A1  Jun. 25, 2020

(30) Foreign Application Priority Data

Jul. 11, 2017  (JP) .............................. JP2017-135509

(51) Int. Cl.
*H05K 1/18* (2006.01)
*H05K 1/02* (2006.01)
(Continued)

(52) U.S. Cl.
CPC ......... *H05K 1/181* (2013.01); *H01L 23/3675* (2013.01); *H05K 1/0206* (2013.01);
(Continued)

(58) Field of Classification Search
CPC .... H05K 7/205; H05K 7/209; H05K 7/20854; H05K 7/20545; H05K 7/2039;
(Continued)

(56) References Cited

U.S. PATENT DOCUMENTS 7,381,066 B2 * 6/2008 Higashiguchi ...... H01M 10/425
439/83
7,381,905 B2 * 6/2008 Yoshioka ............. H05K 1/0206
174/262
(Continued)

FOREIGN PATENT DOCUMENTS

JP  60-2873 U  1/1985
JP  10-229263 A  8/1998
(Continued)

OTHER PUBLICATIONS

English Translation of JP2003273297A, Harada, Yoshiharu, Electronic Device, Sep. 2003 (Year: 2003).*
(Continued)

*Primary Examiner* — Zachary Pape
*Assistant Examiner* — Amir A Jalali
(74) *Attorney, Agent, or Firm* — Crowell & Moring LLP

(57) ABSTRACT

Provided is an electronic circuit substrate in which any excess space is not necessary around an electronic component, and position deviation at a time of mounting the electronic component can be prevented with high precision. An electronic circuit substrate 100 includes a printed wiring board 10 and an electronic component 20. The printed wiring board 10 has a first land 11 and a second land 12. The electronic component 20 has a first bond portion 24 which is bonded to the first land 11 with solder, and a second bond portion 25 which is bonded to the second land 12 with solder. The bond area of the first land 11 and the first bond portion 24 is larger than the bond area of the second land 12

(Continued)

and the second bond portion 25. In one direction D1, the position of an outer side edge 24b of the first bond portion 24 is set so as to match the position of the outer side edge 11b of the first land 11.

8 Claims, 8 Drawing Sheets

(51) Int. Cl.
  *H05K 1/11* (2006.01)
  *H01L 23/367* (2006.01)
(52) U.S. Cl.
  CPC ... *H05K 1/113* (2013.01); *H05K 2201/10166* (2013.01); *H05K 2201/10628* (2013.01)
(58) Field of Classification Search
  CPC ....... H05K 1/144; H05K 1/0204–0207; H05K 1/021; H05K 1/11–116; H05K 1/181; H05K 3/0061; H05K 3/341; H05K 3/303–308; H05K 13/0465; H05K 2201/06; H05K 2201/09572; H05K 2201/10666; H05K 2201/10166; H05K 2201/10446–10462; H05K 2201/10628–10651; H05K 2203/0455; H01L 23/3675; H01L 23/488–492; H01L 23/49827; H01L 23/49503–49524; H01L 21/486; H01L 21/4871
  See application file for complete search history.

(56) References Cited

U.S. PATENT DOCUMENTS

| | | | | |
|---|---|---|---|---|
| 10,199,312 B1 * | 2/2019 | Rivera-Marty | ... | H01L 23/49838 |
| 10,211,128 B2 * | 2/2019 | Mangrum | ........... | H01L 23/4093 |
| 10,375,816 B2 * | 8/2019 | Yamazaki | .............. | H05K 1/111 |
| 2005/0263318 A1 | 12/2005 | Yoshioka | | |
| 2008/0257585 A1 * | 10/2008 | Morse | .................. | C25D 11/026 |
| | | | | 174/252 |
| 2009/0051049 A1 * | 2/2009 | Kasuya | ............. | H01L 23/49513 |
| | | | | 257/782 |
| 2011/0147925 A1 * | 6/2011 | van Kempen | ........... | H05K 1/11 |
| | | | | 257/737 |
| 2013/0258658 A1 * | 10/2013 | Hussell | ............... | H01L 25/0753 |
| | | | | 362/235 |
| 2013/0328200 A1 * | 12/2013 | Bae | .................... | H01L 23/49827 |
| | | | | 257/762 |
| 2016/0088720 A1 * | 3/2016 | Willis | ................. | H01L 23/3677 |
| | | | | 361/709 |
| 2016/0141232 A1 * | 5/2016 | Cannon | ................. | H01L 23/552 |
| | | | | 257/659 |
| 2016/0172548 A1 * | 6/2016 | Ramachandran | ...... | H05K 1/053 |
| | | | | 438/26 |
| 2018/0027645 A1 * | 1/2018 | Tahara | ..................... | H05K 1/02 |
| | | | | 361/707 |
| 2018/0049316 A1 * | 2/2018 | Muronoi | ................ | H05K 3/341 |

FOREIGN PATENT DOCUMENTS

| | | | | |
|---|---|---|---|---|
| JP | 2003-273297 A | | 9/2003 | |
| JP | 2003273297 A | * | 9/2003 | ... H01L 2224/48091 |
| JP | 2005-340684 A | | 12/2005 | |
| JP | 2013-62351 A | | 4/2013 | |

OTHER PUBLICATIONS

International Search Report (PCT/ISA/210) issued in PCT Application No. PCT/JP2018/021133 dated Sep. 18, 2018 with English translation (three (3) pages).
Japanese-language Written Opinion (PCT/ISA/237) issued in PCT Application No. PCT/JP2018/021133 dated Sep. 18, 2018 (four (4) pages).

* cited by examiner

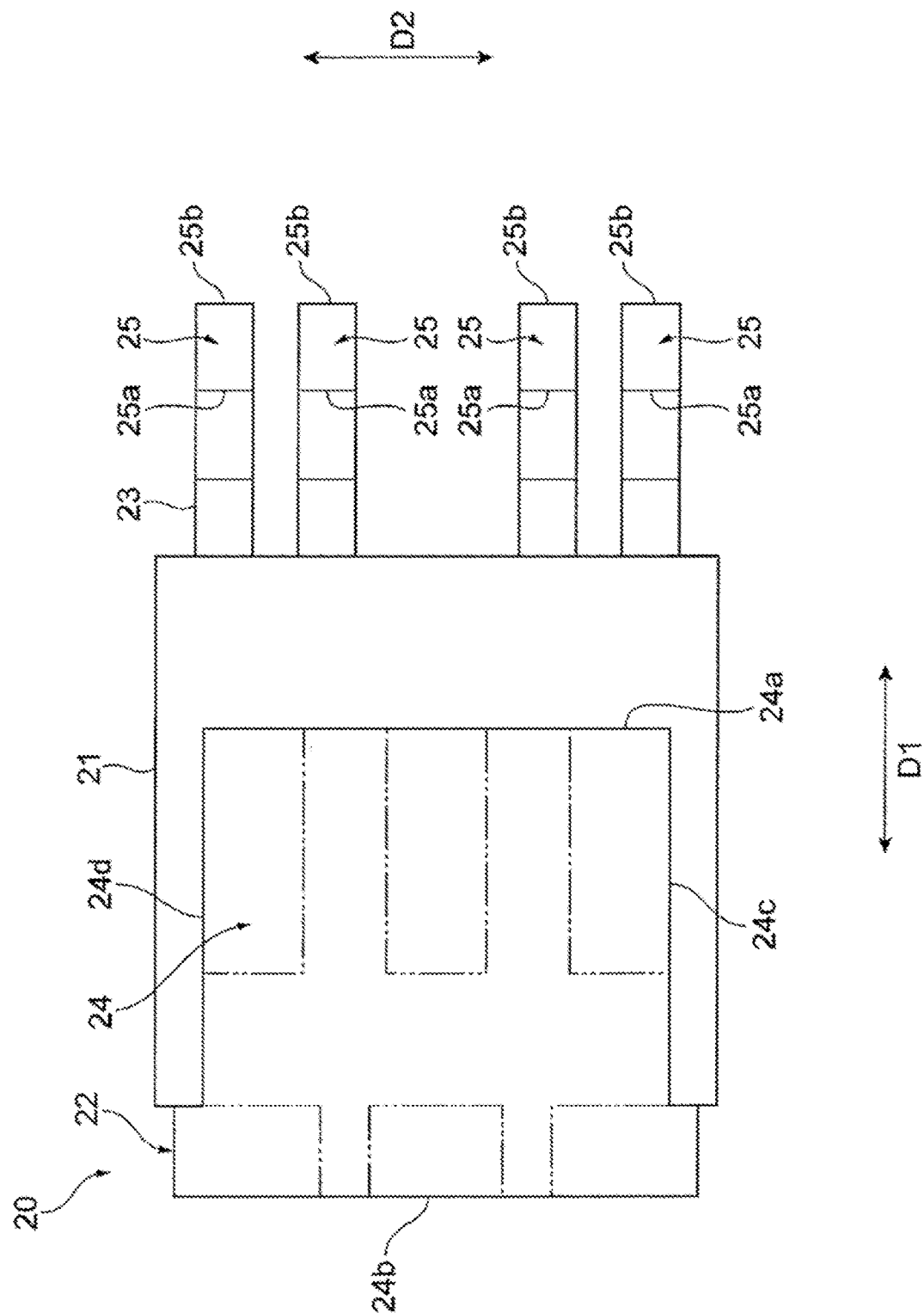
F I G. 5

ELECTRONIC CIRCUIT SUBSTRATE

TECHNICAL FIELD

The present invention relates to an electronic circuit substrate.

BACKGROUND ART

A surface-mount-component mounting printed wiring board has been conventionally known which has one side having a plurality of leads projectedly provided side by side thereon and the other opposite side having one heat dissipating lead projectedly provided thereon, and a mounting method therefor also has been conventionally known (see Patent Document 1). This invention is configured to prevent, when mounting a surface mount component by soldering, the surface mount component from being strongly pulled toward the heat dissipating lead side due to a force of the solder wettability, thereby preventing occurrence of position deviation of the surface mount component.

The printed wiring board disclosed in Patent Document 1 includes a first pad with which the leads are soldered, and a second pad with which the heat dissipating lead is soldered. The second pad is a specific region part having a heat dissipating conductor pattern provided on the printed wiring board. The specific region part includes: a main section which adjoins an edge, of the second pad, on the side of the surface mount component mounted on the printed wiring board and which has a shape and dimensions corresponding to the heat dissipating lead; and an auxiliary section which is projected from the main section in a relative direction of the leads and the heat dissipating lead of the mounted surface mount component. In the second pad, the overall surface of the heat dissipating conductor pattern excluding the specific region part is covered with a resist (see Patent Document 1, claim 1, and the like).

Furthermore, regarding an electronic component mounting structure in which angular deviation at a time of mounting is required to be small, an invention particularly pertaining to an electronic component mounting structure having a sensing shaft such as a current sensor or an acceleration sensor has been known (see Patent Document 2). The electronic component mounting structure disclosed in Patent Document 2 is for mounting, on a substrate provided with a plurality of connection lands, an electronic component having a plurality of metallic lead terminals to be soldered with the connection lands. In the electronic component, the plurality of lead terminals are extended from a side surface of a base body having a substantially rectangular parallelepiped shape.

The plurality of lead terminals include alignment lead terminals which are provided at least two of the four corners of the base body, and an electrode lead terminal which is other than the alignment lead terminals and which is electrically connected to an electronic circuit in the base body. The alignment lead terminals are extended to be longer than the electrode lead terminal. In addition, the plurality of connection lands include alignment connection lands which are soldered with the alignment lead terminals, and an electrode connection land which is soldered with the electrode lead terminal. The length of each of the alignment connection lands is longer than the length of the electrode connection land (see Patent Document 2, claim 1, and the like).

PRIOR ART DOCUMENT

Patent Documents

Patent Document 1: JP-10-229263-A
Patent Document 2: JP-2013-062351-A

SUMMARY OF THE INVENTION

Problems to be Solved by the Invention

The printed wiring board disclosed in Patent Document 1 inhibits movement of the surface mount component by means of a resist end surface which serves as a kind of a barrier at the boundary between the main section of the second pad and the resist (see Patent Document 1, paragraph [0011], and the like). However, during a step of manufacturing the printed wiring board, the resist is applied after the second pad is formed. Therefore, deviation of the position of the resist with respect to the second pad leads to deviation of the position of the resist end surface. As a result, the position of the surface mount component may be deviated.

Furthermore, in the electronic component mounting structure disclosed in Patent Document 2, the alignment lead terminals need to be extended to be longer than the electrode lead terminals, and the length of each of the alignment connection lands needs to be longer than the length of the electrode connection land, as described above, in order to obtain a self-alignment effect. Accordingly, a space for the alignment lead terminals and the alignment connection lands, which are longer than the lead terminals and the electrode connection lands, needs to be ensured around the electronic component.

Therefore, the present invention provides an electronic circuit substrate in which any excess space is not necessary around an electronic component, and position deviation at a time of mounting the electronic component can be prevented with high precision.

Means for Solving the Problems

The present invention is an electronic circuit substrate including a printed wiring board, and an electronic component which is mounted on a surface of the printed wiring board. The printed wiring board has a first land and a second land which are arranged in one direction along the surface; the electronic component has a first bond portion which is bonded to the first land with solder, and a second bond portion which is bonded to the second land with solder; a bond area of the first land and the first bond portion is larger than a bond area of the second land and the second bond portion; the first land and the second land have, in the one direction, respective inner side edges which are closed to each other and respective outer side edges which are opposite to the corresponding inner side edges and which are distant from each other; the first bond portion and the second bond portion have, in the one direction, respective inner side edges which are close to each other, and respective outer side edges which are opposite to the corresponding inner side edges and which are distant from each other; and in the one direction, a position of the outer side edge of the first bond portion is set so as to match a position of the outer side edge of the first land.

Effects of the Invention

The present invention can provide an electronic circuit substrate in which any excess space is not necessary around an electronic component, and position deviation at a time of mounting the electronic component can be prevented with high precision.

BRIEF DESCRIPTION OF THE DRAWINGS

FIG. 5 is a bottom view of an electronic component constituting the electronic circuit substrate illustrated in FIG. 1.

MODES FOR CARRYING OUT THE INVENTION

Hereinafter, embodiments of an electronic circuit substrate according to the present invention will be explained with reference to the drawings.

First Embodiment

Figure 1:
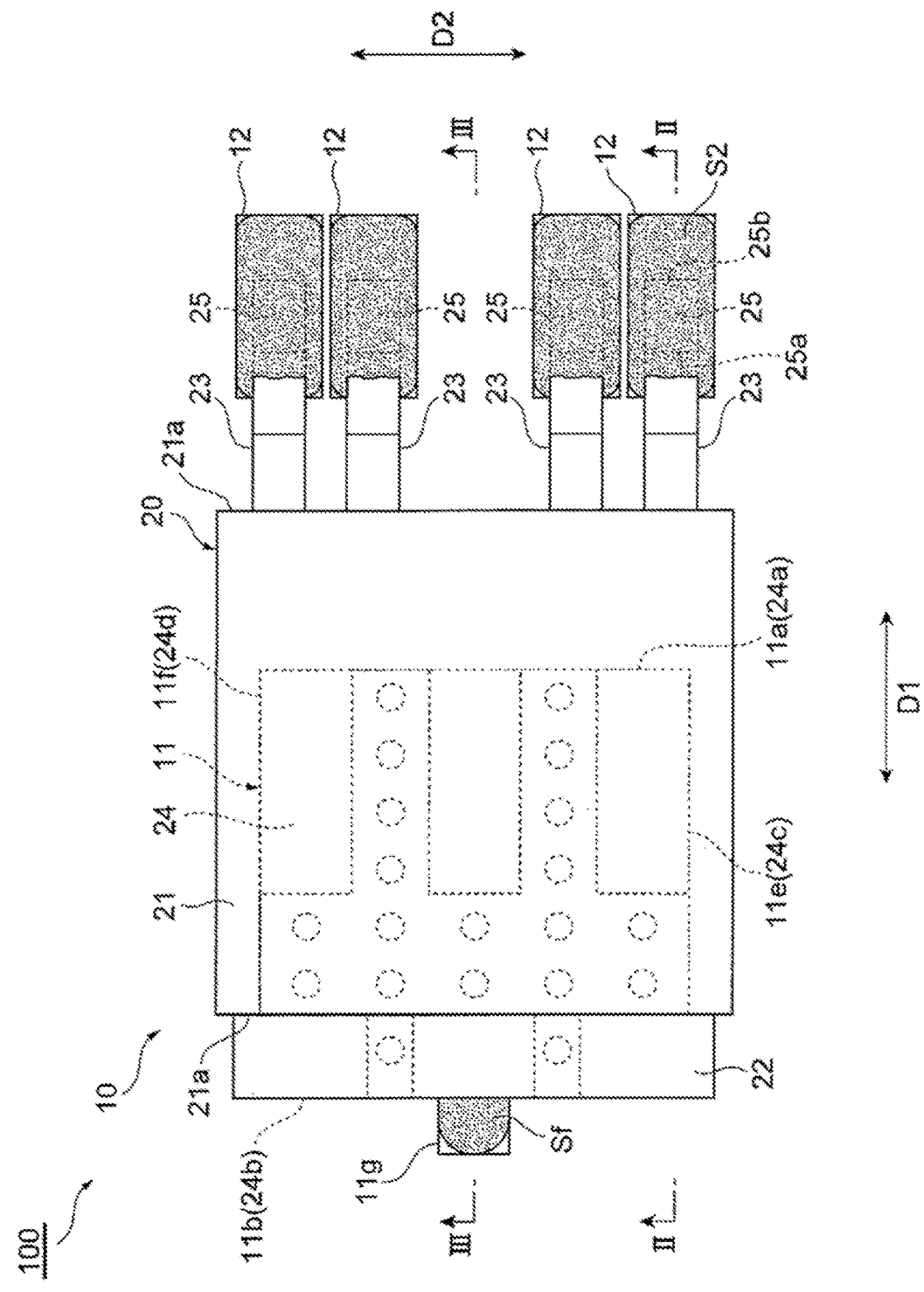
FIG. 1 is an enlarged plan view of the main part of an electronic circuit substrate according to a first embodiment of the present invention.
Figure 2:
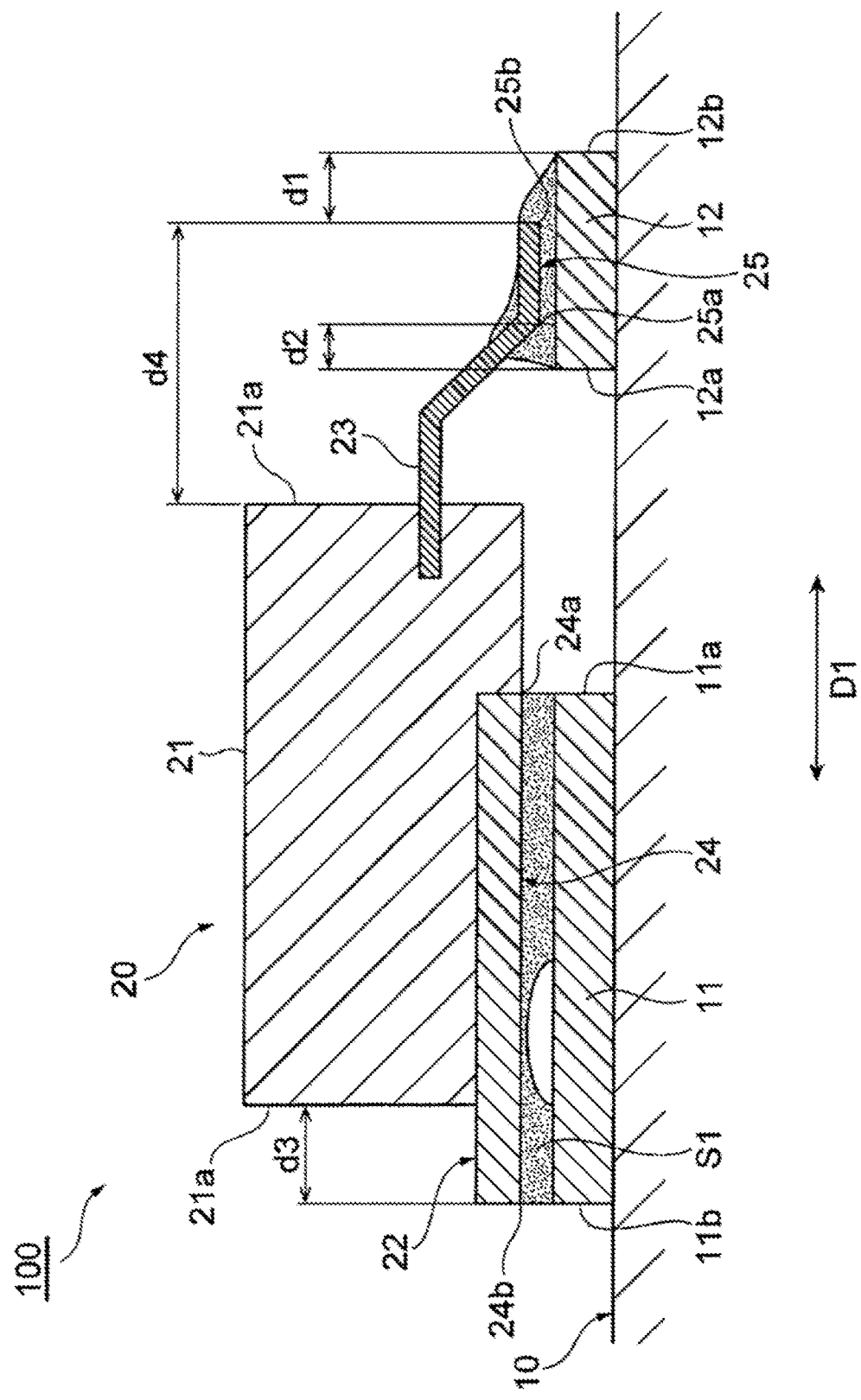
FIG. 2 is a cross-sectional view of the electronic circuit substrate taken along line II-II in FIG. 1.
Figure 3:
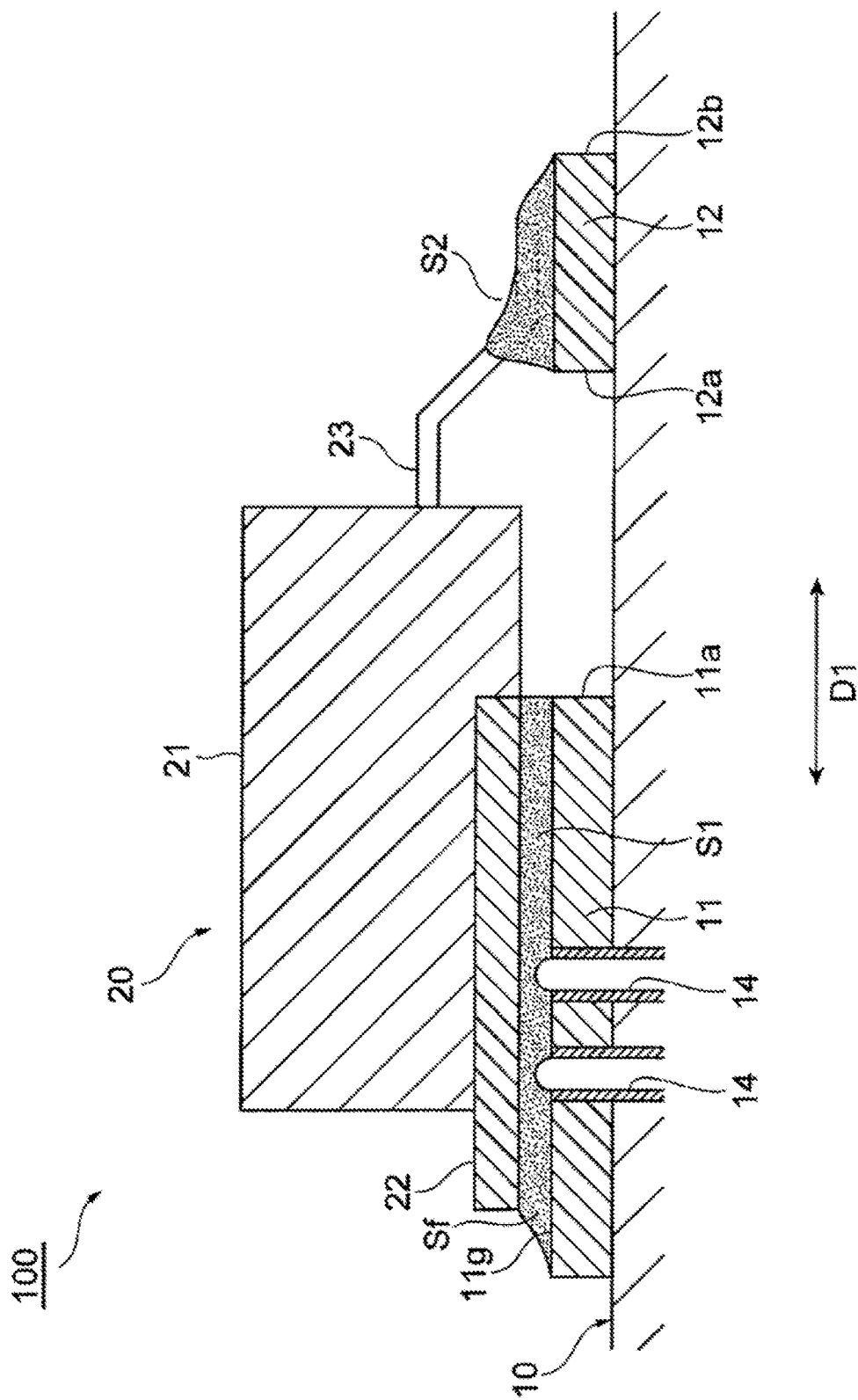
FIG. 3 is a cross-sectional view of the electronic circuit substrate taken along line III-III in FIG. 1.

FIG. 1 is an enlarged plan view of the main part of an electronic circuit substrate 100 according to a first embodiment of the present invention. FIG. 2 is a cross-sectional view of the electronic circuit substrate 100 taken along line II-II in FIG. 1. FIG. 3 is a cross-sectional view of the electronic circuit substrate 100 taken along line III-III in FIG. 1.

The electronic circuit substrate 100 according to the present embodiment constitutes a part of an on-vehicle electronic control unit, for example. High reliability is required for the on-vehicle electronic circuit substrate 100 because the on-vehicle electronic circuit substrate 100 is used in a relatively severe environment which is likely to be under the influence of external forces such as thermal stress caused by temperature change, vibrations, or impacts. The electronic circuit substrate 100 includes a printed wiring board 10, and an electronic component 20 which is mounted on a surface of the printed wiring board 10.

Figure 4:
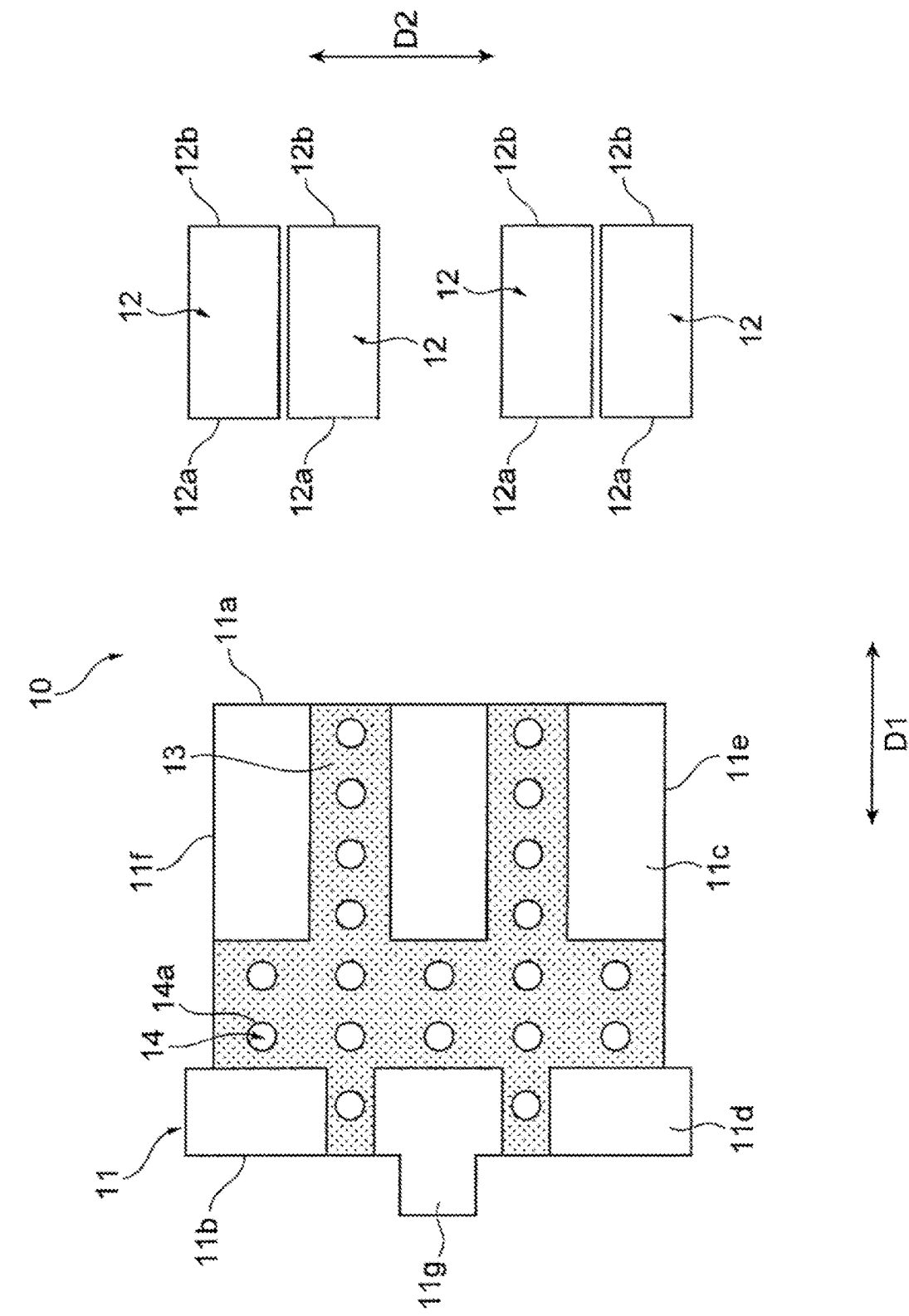
FIG. 4 is an enlarged plan view of the main part of a printed wiring board constituting the electronic circuit substrate illustrated in FIG. 1.

FIG. 4 is an enlarged plan view of the main part of the printed wiring board 10 constituting the electronic circuit substrate 100 illustrated in FIG. 1. The printed wiring board 10 has a first land 11 and a second land 12 arranged in one direction D1 along the surface on which the electronic component 20 is mounted. The printed wiring board 10 has electronic circuit wiring, not illustrated, which is printed on a surface of a substrate made from a raw material having insulating properties, for example. The surface of the substrate and a part of the wiring are covered with a solder resist. The first land 11 and the second land 12 are portions for bonding the electronic component 20 to the electronic circuit wiring on the printed wiring board 10 with solder, for example.

In the one direction D1 along the surface of the printed wiring board 10, the first land 11 and the second land 12 have respective inner side edges 11a and 12a which are close to each other, and respective outer side edges 11b and 12b which are opposite to the corresponding inner side edges 11a and 12a and which are distant from each other. The printed wiring board 10 has one first land 11 and a plurality of the second lands 12 in the present embodiment, but may have a plurality of the first lands 11 and one or more second lands 12, or may have one first land 11 and one second land 12. For example, the surface area of the first land 11 is larger than the surface area of each of the second lands 12, and is larger than the total surface area of the second lands 12.

The first land 11 has a main section 11c and an extension section 11d which are arranged in the one direction D1, for example. The main section 11c of the first land 11 is a section having a rectangular shape disposed on an inner side edge 11a-side, and occupies most of the first land 11. The extension section 11d of the first land 11 is a section disposed on an outer side edge 11b-side and includes both ends projected from respective side edges 11e and 11f of the main section 11c while having a dimension larger than that of the main section 11c in a direction D2 that is orthogonal to the one direction D1 and that is along the surface of the printed wiring board 10. As illustrated in FIGS. 1 and 2, the extension section 11d of the first land 11 is provided so as to be extended, in the one direction D1, further outwardly from a side edge 21a of a main body portion 21 of the electronic component 20 which is mounted on the printed wiring board 10.

The first land 11 has a projected section 11g projected in the one direction D1 from the outer side edge 11b, for example. The projected section is a section where a solder fillet Sf is formed during mounting of the electronic component 20, as illustrated in FIGS. 1 and 3, and is provided for confirming the solder fillet Sf in an inspection which is conducted after the electronic component 20 is mounted. The projected section 11g of the first land 11 has a rectangular shape in the present embodiment, but the shape of the projected section 11g is not limited to a particular shape. The surface area of the projected section 11g is smaller than the surface area of the first land 11 excluding the projected section 11g.

From the viewpoint of ensuring a sufficient wiring space and a sufficient mounting space around the electronic component 20, the projected section 11g is preferably as small as possible within a range for enabling an inspection of the solder fillet Sf in an automatic optical inspection, for example. Specifically, the dimension of the projected section 11g in each of the one direction D1 and the direction D2 orthogonal to the one direction D1 can be set to 1 mm or less, preferably set to 0.5 mm or less, and more preferably set to approximately 0.25 mm.

The first land 11 has, in a surface thereof, openings 14a of a plurality of thermal vias 14, for example. The thermal vias 14 are through holes passing through the first land 11 and the printed wiring board 10, for example. The inner wall surfaces of the thermal vias 14 are plated with copper such that heat in a heat dissipating portion 22 which is bonded to the first land 11 with solder is dissipated to the rear surface or the like of the printed wiring board 10, for example.

For example, the surface of the first land 11 is partially covered with solder resist 13. The solder resist 13 is formed so as to have a band-like shape in each of the arrangement directions of the thermal vias 14 such as the one direction D1 and the direction D2 orthogonal thereto. The thermal vias 14 have copper-plated inner through holes which are open in a region, on the surface of the first land 11, covered with the solder resist 13.

The second lands 12 each have a rectangular shape, for example, and are formed at positions separated from the first land 11 by a predetermined distance in the one direction D1. In the present embodiment, four second lands 12 are provided side by side at a prescribed interval in the direction D2 orthogonal to the one direction D1. The second lands 12 are provided such that two pairs each including two second lands 12 close to each other are disposed in the direction D2 orthogonal to the one direction D1 with a space therebetween. The space between the two pairs is wider than the space between the second lands 12 in the same pair.

FIG. 5 is a bottom view of the electronic component 20 constituting the electronic circuit substrate 100 illustrated in FIG. 1. In the present embodiment, the electronic component 20 is a power transistor having a maximum rated collector loss of 1 W or larger, for example. Note that the electronic component 20 is not limited to power transistors, and any electronic component 20 can be mounted on the electronic circuit substrate 100.

The electronic component 20 includes the main body portion 21, the heat dissipating portion 22 provided to the main body portion 21, and lead terminals 23 extending in the one direction D1 from the main body portion 21, for example. The main body portion 21 of the electronic component 20 is a mold portion of the power transistor, for example. The heat dissipating portion 22 of the electronic component 20 is a heat sink of the power transistor, for example. Note that the heat dissipating portion 22 may be an electrode portion of the electronic component 20 to be grounded, to be connected to a power source, or to be connected to the electronic circuit wiring.

The electronic component 20 has a first bond portion 24 which is bonded to the first land 11 with solder, and second bond portions 25 which are bonded to the second lands 12 with solder. In addition, the first bond portion 24 and each of the second bond portions 25 of the electronic component 20 have, in the one direction D1, respective inner side edges 24a and 25a which are close to each other, and respective outer side edges 24b and 25b which are opposite to the corresponding inner side edges 24a and 25a and which are distant from each other.

In the present embodiment, the first bond portion 24 is a surface, of the heat dissipating portion 22, opposed to the first land 11, and the second bond portions 25 are ends, of the lead terminals 23, opposed to the second lands 12. More specifically, the first bond portion 24 is a surface, of the heat dissipating portion 22, opposed to a portion of the first land 11 excluding the projected section 11g, a region where the solder resist 13 is formed, and the opening 14a of the thermal vias 14. That is, in the present embodiment, the first bond portion 24 of the electronic component 20 is divided into a plurality of regions.

As illustrated in FIGS. 4 and 5, the heat dissipating portion 22 of the electronic component 20 has a shape and dimensions identical to those of the first land 11 excluding the projected section 11g, for example. That is, if the first land 11 does not have the projected section 11g, the plane shape of the first land 11 is congruent with the plane shape of the heat dissipating portion 22. Accordingly, in the plan view illustrated in FIG. 1, the side edges 24a, 24b, 24c and 24d on the four sides of the first bond portion 24 overlap the side edges 11a, 11b, 11e and 11f on the four sides of the first land 11. In other words, in the plan view illustrated in FIG. 1, the heat dissipating portion 22 and the first land 11 entirely and completely overlap each other.

That is, in the electronic circuit substrate 100 according to the present embodiment, in the direction D2 that is orthogonal to the one direction D1 and is along the surface of the printed wiring board 10, the positions of both side edges 24c and 24d of the first bond portion 24 of the electronic component 20 are set so as to match the positions of both side edges 11e and 11f of the first land 11 of the printed wiring board 10. Here, setting the positions of the side edges 11e and 11f so as to match the positions of the side edges 24c and 24d, respectively, means arranging the side edges 11e and 11f so as to overlap, in a direction perpendicular to the surface of the printed wiring board 10, the side edges 24c and 24d, respectively, for example. In other words, the both side edges 24c and 24d of the first bond portion 24 and the both side edges 11e and 11f of the first land 11 are disposed on one plane that is perpendicular to the surface of the printed wiring board 10 and is parallel with the one direction D1, and are disposed so as to be flush with each other in the direction D2 intersecting the one direction D1, without having any step.

Note that examples of a case where the positions of the both side edges 24c and 24d of the first bond portion 24 are set so as to match the both side edges 11e and 11f of the first land 11 in the direction D2 orthogonal to the one direction D1, include not only a case where the both side edges 24c and 24d completely overlap the both side edges 11e and 11f in a direction perpendicular to the surface of the printed wiring board 10, but also a case where the both side edges 24c and 24d are slightly deviated in position from the both side edges 11e and 11f within an allowable range. Such position deviation within the allowable range is slight position deviation caused by the surface tension of a solder fused during solder bonding, or by contraction involved in solidification of the solder, and is 0.1 mm or less, for example.

In the present embodiment, the bond area of the first land 11 and the first bond portion 24 is larger than the bond area of the second lands 12 and the second bond portions 25. More specifically, the bond area of the first land 11 and the first bond portion 24 of the electronic component 20 is equal to or larger than the area of a portion of the first land 11 excluding the projected section 11g, a region where the solder resist 13 is formed, and the openings 14a of the thermal vias 14, and is equal to or smaller than the area of the surface, of the heat dissipating portion 22, opposed to the first land 11, that is, equal to or smaller than the area of the first bond portion 24. The bond area of the second lands 12 and the second bond portions 25 of the electronic component 20 is substantially equal to the total area of the ends of a plurality of the lead terminals 23 opposed to a plurality of the second lands 12.

The most distinctive feature of the electronic circuit substrate 100 according to the present embodiment is that, in the one direction D1, the position of the outer side edge 24b of the first bond portion 24 is set so as to match the position of the outer side edge 11b of the first land 11, as illustrated in FIGS. 1 and 2. Here, setting the positions of the outer side edges 24b and 11b so as to match in the one direction D1 means arranging the outer side edges 24b and 11b so as to overlap in a direction perpendicular to the surface of the printed wiring board 10, for example. In other words, the outer side edge 24b of the first bond portion 24 and the outer side edge 11b of the first land 11 are disposed on one plane that is perpendicular to the surface of the printed wiring board 10 and is perpendicular to the one direction D1, and are disposed so as to be flush with each other in the one direction D1 without having any step.

Note that examples of a case where the positions of the outer side edges 24b and 11b are set so as to match in the one direction D1, include not only a case where the outer side edges 24b and 11b completely overlap in a direction perpendicular to the surface of the printed wiring board 10, but also a case where the outer side edges 24b and 11b are slightly deviated in position from each other due to the surface tension of a solder fused during solder bonding, or by contraction involved in solidification of the solder. Such allowable slight position deviation is 0.1 mm or less, for example.

In addition, in the electronic circuit substrate 100 according to the present embodiment, in the one direction D1, the outer side edge 25b and the inner side edge 25a of each of the second bond portions 25 are positioned between the outer side edge 12b and the inner side edge 12a of the corresponding second land 12. A distance d1 between the outer side edge 25b of the second bond portion 25 and the outer side edge 12b of the second land 12, and a distance d2 between the inner side edge 25a of the second bond portion 25 and the inner side edge 12a of the second land 12 are each set to be approximately 0.5 mm, for example, in view of the dimension tolerance of the electronic component 20, allowable position deviation of the electronic component 20, dimensions necessary for an automatic optical inspection, and the like.

In addition, in the one direction D1, an end of the heat dissipating portion 22 of the electronic component 20 is projected toward the outside of the main body portion 21. Moreover, in the one direction D1, the lead terminals 23 extend in a direction opposite to the projected direction of the heat dissipating portion 22. Accordingly, in the one direction D1, the outer side edge 24b of the first bond portion 24 and the outer side edges 25b of the second bond portions 25 are positioned outside both side edges 21a and 21a of the main body portion 21 of the electronic component 20.

In addition, in the electronic component 20, the dimension, of each of the lead terminals 23 extending in the one direction D1, from the main body portion 21 to the end of the lead terminal 23, is larger than the projected amount, in the one direction D1, of the heat dissipating portion 22 from the main body portion 21. Accordingly, in the one direction D1, a distance d3 between the outer side edge 24b of the first bond portion 24 and the one side edge 21a of the main body portion 21 is smaller than a distance d4 between the outer side edge 25b of each of the second bond portions 25 and the other side edge 21a of the main body portion 21.

In addition, in the one direction D1, an end of the heat dissipating portion 22 opposite to the end projected from the one side edge 21a of the main body portion 21 of the electronic component 20 is positioned between the main body portion 21 and the printed wiring board 10. Meanwhile, the ends of the lead terminals 23 of the electronic component 20 are extended to the outside of the main body portion 21 of the electronic component 20. Accordingly, in the one direction D1, the inner side edge 24a of the first bond portion 24 of the electronic component 20 is positioned inside both side edges 21a and 21a of the main body portion 21 of the electronic component 20, and the inner side edges 25a of the second bond portions 25 of the electronic component 20 are positioned outside the both side edges 21a and 21a of the main body portion 21.

In addition, in the electronic circuit substrate 100 according to the present embodiment, the first bond portion 24 and the second bond portions 25 of the electronic component 20, and the first land 11 and the second lands 12 of the printed wiring board 10 are provided asymmetrically with respect to the one direction D1. Specifically, in the one direction D1, the first land 11 and the first bond portion 24 the bond area of which is large, are provided on one side of the electronic component 20. Moreover, in the one direction D1, the second lands 12 and the second bond portions 25 the bond area of which is small are provided on the other side of the electronic component 20.

Hereinafter, effects of the electronic circuit substrate 100 according to the present embodiment will be explained on the basis of comparison with an electronic circuit substrate 900 according to a comparative example.

Figure 8:
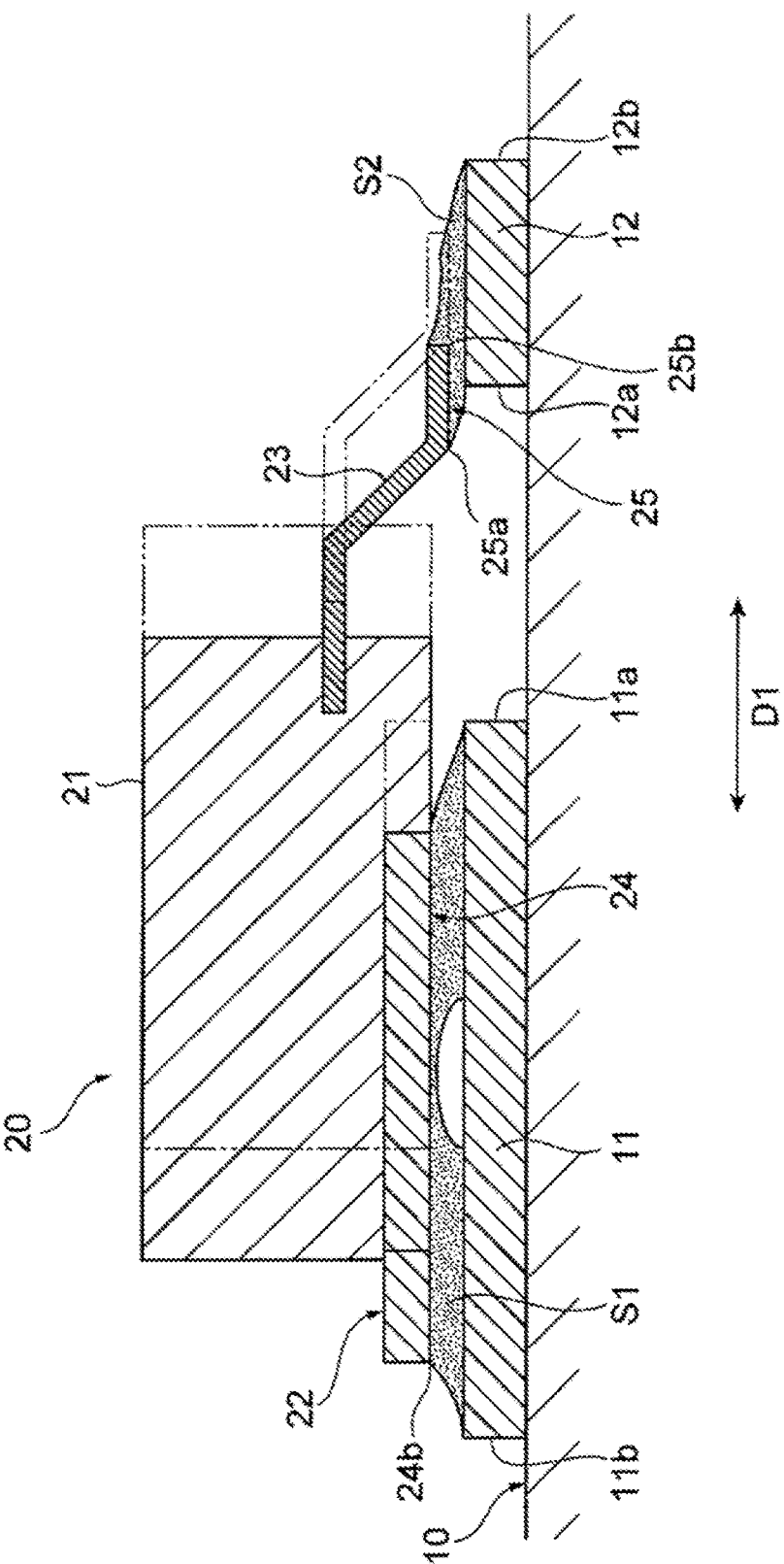
FIG. 8 is a cross-sectional view of an electronic circuit substrate according to a comparative example corresponding to FIG. 2.

FIG. 8 is a cross-sectional view of the electronic circuit substrate 900 according to a comparative example corresponding to FIG. 2. The electronic circuit substrate 900 according to the comparative example differs from the electronic circuit substrate 100 according to the present embodiment in that, in the electronic circuit substrate 900, the position of the outer side edge 24b of the first bond portion 24 of the electronic component 20 is not set so as to match the position of the outer side edge 11b of the first land 11 of the printed wiring board 10. The remaining configuration of the electronic circuit substrate 900 according to the comparative example is similar to that of the electronic circuit substrate 100 according to the present embodiment. Therefore, a component similar to that of the electronic circuit substrate 100 is denoted by the same reference numeral, and an explanation thereof will be omitted.

To mount the electronic component 20 onto the electronic circuit substrate 100 according to the comparative example, solder pastes are first printed on a surface of the first land 11 and surfaces of the second lands 12, for example. Next, as indicated by two-dot chain lines, the first bond portion 24 of the electronic component 20 is placed on the first land 11, and the electronic component 20 is placed such that the second bond portions 25 are positioned, in the one direction D1, between the inner side edges 12a and the outer side edges 12b of the second lands 12. Next, the solder pastes are heated by a solder reflow process so that the first bond portion 24 and the second bond portions 25 of the electronic component 20 are bonded to the first land 11 and the second lands 12 of the printed wiring board 10 with solder.

Here, the bond area of the first bond portion 24 and the first land 11 is larger than the bond area of the second bond portions 25 and the second lands 12. Accordingly, the volume of a solder S1 disposed between the first bond portion 24 and the first land 11 is larger than the volume of a solder S2 disposed between the second bond portions 25 and the second lands 12. Specifically, the volume of the solder S1 disposed between the first bond portion 24 and the first land 11 may be several times, e.g., approximately five times, larger than the volume of the solder S2 disposed between the second bond portions 25 and the second lands 12. In this case, since the solder S1 fused between the first bond portion 24 and the first land 11 has a volume larger than the volume of the solder S2 fused between the second bond portions 25 and the second lands 12, the solder S1 is wetly spread out into a wider range.

Here, in the electronic circuit substrate 900 according to the comparative example, in the one direction D1, the position of the outer side edge 24b of the first bond portion 24 of the electronic component 20 is not set so as to match the position of the outer side edge 11b of the first land 11 of the printed wiring board 10. Accordingly, the electronic component 20 is attracted toward the first land 11 by the surface tension of the solder S1 which has a larger volume between the first bond portion 24 and the first land 11 and which is wetly spread out into a wider range. This causes position deviation of the electronic component 20 beyond the allowable range. For example, the inner side edges 25*a* of the second bond portions 25 of the electronic component 20 move to the outside of the second lands 12. Thus, a bonding defect between the second bond portions 25 and the second lands 12 may be generated. Moreover, when position deviation of the electronic component 20 from the second lands 12 toward the first land 11 in the one direction D1 occurs, the fillet of a solder for bonding the second bond portions 25 of the electronic component 20 to the second lands 12 becomes an odd shape. More specifically, the fillet shape of the solder is disordered on the outer side edge 25*b*-sides of the second bond portions 25 of the electronic component 20, and no solder filet is formed on the inner side edge 25*a*-sides of the second bond portions 25 of the electronic component 20. Further, in the case where position deviation of the electronic component 20 has occurred beyond the allowable range, the electronic circuit substrate 900 is discarded so that the yield is lowered.

Regarding this point, similar to the electronic circuit substrate 900 according to the comparative example, the electronic circuit substrate 100 according to the present embodiment includes the printed wiring board 10, and the electronic component 20 which is mounted on the surface of the printed wiring board 10. The printed wiring board 10 includes the first land 11 and the second lands 12 arranged in the one direction D1 along the surface. The electronic component 20 has the first bond portion 24 which is bonded to the first land 11 with solder, and the second bond portions 25 which are bonded to the second lands 12 with solder. The bond area of the first land 11 and the first bond portion 24 is larger than the bond area of the second lands 12 and the second bond portions 25. The first land 11 and each of the second lands 12 have, in the one direction D1, the respective inner side edges 11*a* and 12*a* which are close to each other, and the respective outer side edges 11*b* and 12*b* which are opposite to the corresponding inner side edges 11*a* and 12*a* and which are distant from each other. The first bond portion 24 and each of the second bond portions 25 have, in the one direction D1, the respective inner side edges 24*a* and 25*a* which are close to each other and the respective outer side edges 24*b* and 25*b* which are opposite to the corresponding inner side edges 24*a* and 25*a* and which are distant from each other. The electronic circuit substrate 100 according to the present embodiment is different from the electronic circuit substrate 900 according to the comparative example in that, in the electronic circuit substrate 100, in the one direction D1, the position of the outer side edge 24*b* of the first bond portion 24 is set so as to match the position of the outer side edge 11*b* of the first land 11.

With this configuration, when the first bond portion 24 and the second bond portions 25 of the electronic component 20 are bonded to the first land 11 and the second lands 12 of the printed wiring board 10 with solder, the solder S1 having a large volume between the first bond portion 24 and the first land 11 is prevented from being wetly spread out toward a direction away from the second lands 12 in the one direction D1. Accordingly, position deviation of the electronic component 20 beyond the allowable range toward the direction away from the second lands 12 in the one direction D1 can be prevented, whereby generation of a bonding defect between the first bond portion 24 and the second bond portions 25 of the electronic component 20 and the first land 11 and the second lands 12 of the printed wiring board 10 can be prevented. Therefore, with the electronic circuit substrate 100 according to the present embodiment, manufacturing defects can be reduced, and the yield can be improved. In addition, in the electronic circuit substrate 100 according to the present embodiment, a conventional large space for covering a resist or a conventional space for alignment lead terminals and alignment connection lands do not need to be ensured. Therefore, with the electronic circuit substrate 100 according to the present embodiment, any excess space is not necessary around the electronic component 20, and position deviation at a time of mounting the electronic component 20 can be prevented.

In addition, in the electronic circuit substrate 100 according to the present embodiment, in the one direction D1, the outer side edges 25*b* and the inner side edges 25*a* of the second bond portions 25 are positioned between the outer side edges 12*b* and the inner side edges 12*a* of the second lands 12, as explained above. Accordingly, generation of a bonding defect between the second bond portions 25 of the electronic component 20 and the second lands 12 of the printed wiring board 10 can be more reliably prevented so that the reliability of the electronic circuit substrate 100 can be further improved.

In addition, in the electronic circuit substrate 100 according to the present embodiment, in the one direction D1, the outer side edge 24*b* of the first bond portion 24 and the outer side edges 25*b* of the second bond portions 25 are positioned outside the both side edges 21*a* and 21*a* of the main body portion 21 of the electronic component 20, as explained above. Moreover, in the one direction D1, the distance d3 between the outer side edge 24*b* of the first bond portion 24 and the one side edge 21*a* of the main body portion 21 is smaller than the distance d4 of the outer side edge 25*b* of each of the second bond portions 25 and the other side edge 21*a* of the main body portion 21. Accordingly, a space necessary for bonding the first bond portion 24 and the first land 11, which is larger than a space for the second bond portions 25 and the second lands 12, can be reduced, whereby a larger space can be ensured around the electronic component 20.

In addition, in the electronic circuit substrate 100 according to the present embodiment, in the one direction D1, the inner side edge 24*a* of the first bond portion 24 is positioned inside the both side edges 21*a* and 21*a* of the main body portion 21, and the inner side edges 25*a* of the second bond portions 25 are positioned outside the both side edges 21*a* and 21*a* of the main body portion 21, as explained above. Accordingly, a space necessary for bonding the first bond portion 24 and the first land 11, which is larger than a space for the second bond portions 25 and the second lands 12, can be reduced, whereby a larger space can be ensured around the electronic component 20.

In addition, in the electronic circuit substrate 100 according to the present embodiment, in the one direction D1, the second lands 12 and the second bond portions 25 are provided on one side of the electronic component 20, as explained above. Thus, the electronic component 20 in which the first bond portions 24 and the second bond portions 25 are asymmetric with respect to the one direction D1 is likely to be deviated in position at a time of solder bonding. However, with the electronic circuit substrate 100 according to the present embodiment, position deviation of the electronic component 20 can be prevented by means of the aforementioned configuration and the connection reliability can be improved.

In addition, in the electronic circuit substrate 100 according to the present embodiment, in the direction D2 that is orthogonal to the one direction D1 and is along the surface of the printed wiring board 10, the positions of the both side edges 24c and 24d of the first bond portion 24 are set so as to match the positions of the both side edges 11e and 11f of the first land 11, as explained above. Accordingly, the fused solder S1 is prevented from being wetly spread in the direction D2 that is orthogonal to the one direction D1 and is along the surface of the printed wiring board 10. Thus, position deviation to the first bond portion 24 in the direction D2 can be prevented so that rotation and position deviation of the electronic component 20 can be more reliably prevented. Therefore, the reliability of the electronic circuit substrate 100 can be further improved.

In addition, in the electronic circuit substrate 100 according to the present embodiment, the first land 11 has the projected section 11g projected in the one direction D1 from the outer side edge, as explained above. Accordingly, although the position of the outer side edge 24b of the first bond portion 24 is set so as to match the position of the outer side edge 11b of the first land 11, the solder fillet Sf formed on the projected section 11g can be confirmed in an automatic optical inspection so that the reliability of solder bonding between the first bond portion 24 and the first land 11 can be improved.

In addition, in the electronic circuit substrate 100 according to the present embodiment, the electronic component 20 includes the main body portion 21, the heat dissipating portion 22 provided to the main body portion 21, and the lead terminals 23 extending in the one direction D1 from the main body portion 21, as explained above. The first bond portion 24 is a surface, of the heat dissipating portion 22, opposed to the first land 11. The second bond portions 25 are ends, of the lead terminals 23, opposed to the second lands 12. The bond area of the heat dissipating portion 22 and the first land 11 is, for example, several times larger than the bond area of the ends of the lead terminals 23 and the second lands 12. Also, the volume of the solder S1 which is used for bonding the heat dissipating portion 22 and the first land 11 is several times larger than the volume of the solder S2 which is used for bonding the ends of the lead terminals 23 and the second lands 12. Also in such a case, the electronic circuit substrate 100 according to the present embodiment can prevent position deviation of the electronic component 20 by means of the aforementioned configuration so that the reliability can be improved.

As explained so far, with the electronic circuit substrate 100 according to the present embodiment, any excess space is not necessary around the electronic component 20, and position deviation at a time of mounting of the electronic component 20 is prevented, whereby a high reliability, which is required for the on-vehicle electronic circuit substrate 100, for example, can be ensured.

Second Embodiment

Next, an electronic circuit substrate 200 according to a second embodiment of the present invention will be explained with reference to FIGS. 6 and 7.

Figure 6:
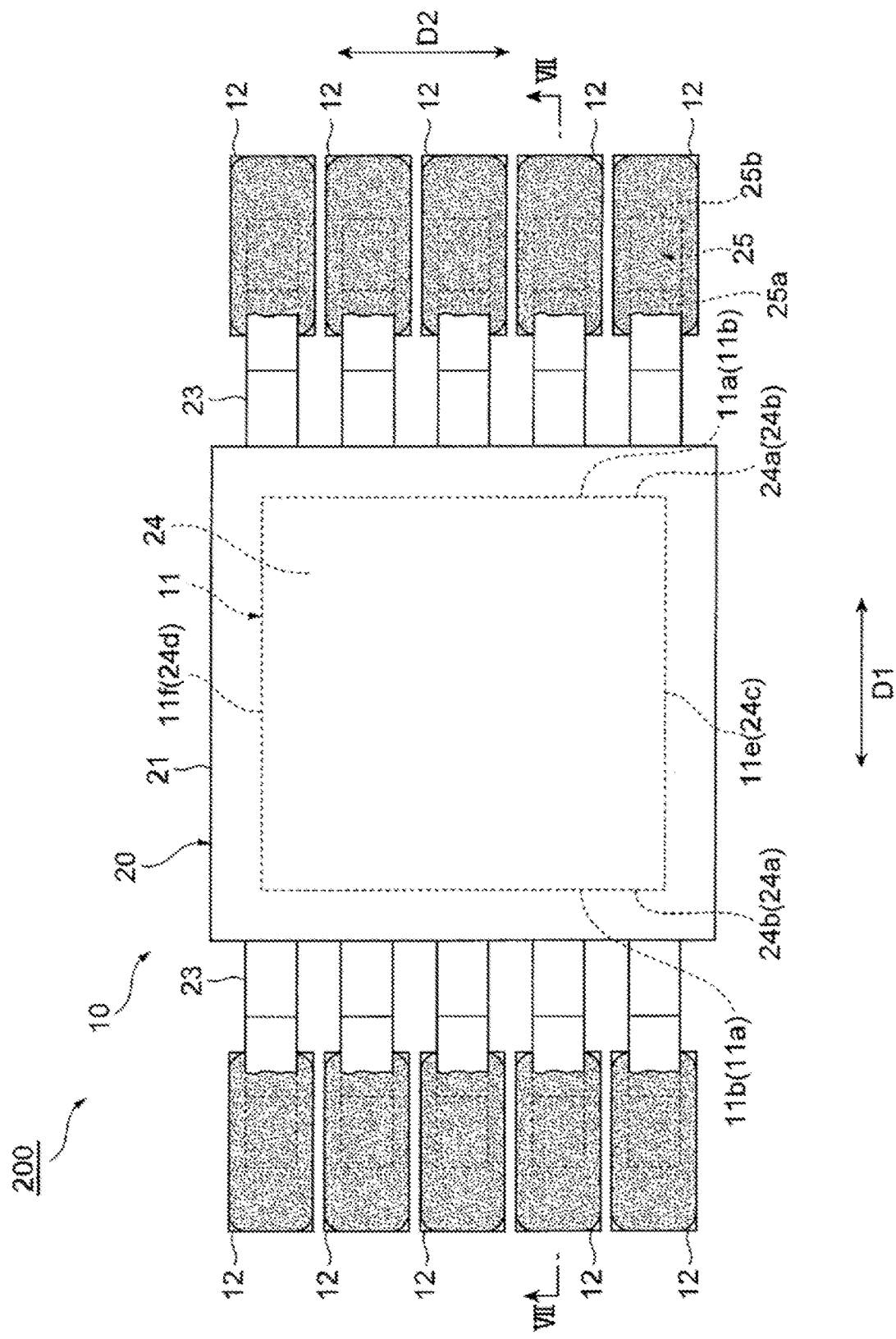
FIG. 6 is an enlarged plan view of the main part of an electronic circuit substrate according to a second embodiment of the present invention.
Figure 7:
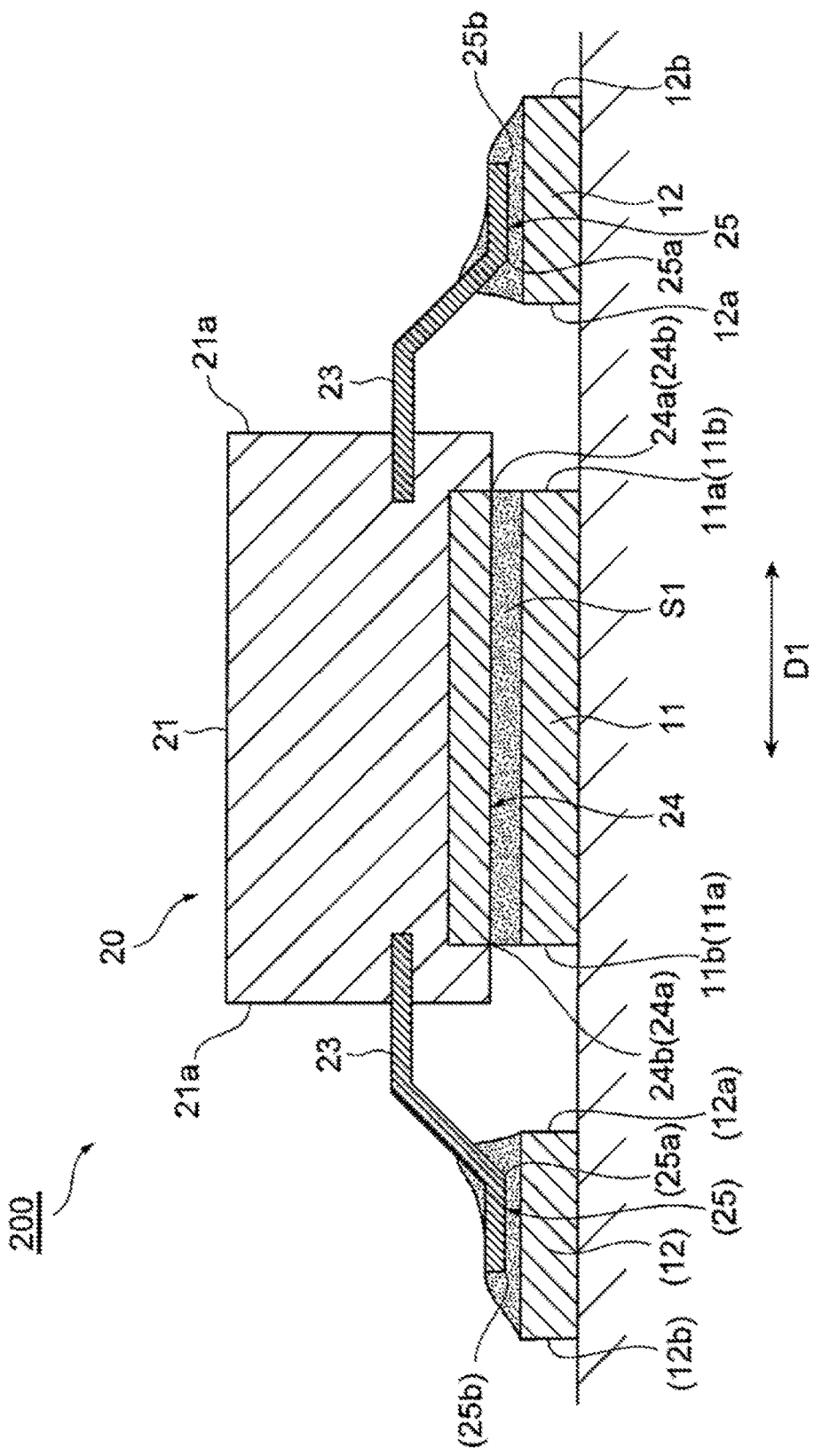
FIG. 7 is a cross-sectional view taken along line VII-VII in FIG. 6.

FIG. 6 is an enlarged plan view of the main part of the electronic circuit substrate 200 according to the second embodiment of the present invention. FIG. 7 is a cross-sectional view taken along line VII-VII in FIG. 6. The electronic circuit substrate 200 according to the present embodiment has a configuration similar to that of the aforementioned electronic circuit substrate 100 according to the first embodiment, except for some features explained below. Therefore, a component of electronic circuit substrate 200 according to the present embodiment similar to that of the electronic circuit substrate 100 according to the first embodiment is denoted by the same reference numeral, and an explanation thereof will be omitted, as appropriate.

In the electronic circuit substrate 200 according to the present embodiment, in the one direction D1, the outer side edge 11b and the inner side edge 11a of the first land 11 are positioned inside the both side edges 21a and 21a of the main body portion 21 of the electronic component 20. Moreover, in the one direction D1, the second lands 12 and the second bond portions 25 are provided on each side of the electronic component 20. Note that, also in the direction D2 that is orthogonal to the one direction D1 and is along the surface of the printed wiring board 10, the second lands 12 and the second bond portions 25 may be provided on each side of the electronic component 20.

With regard to the second lands 12 and the second bond portions 25 on one side of the electronic component 20 in the electronic circuit substrate 200 according to the present embodiment, the position of the outer side edge 24b of the first bond portion 24 is set so as to match, in the one direction D1, the position of the outer side edge 11b of the first land 11, as in the aforementioned electronic circuit substrate 100 according to the first embodiment. Moreover, with regard to the second lands 12 and the second bond portions 25 on a side opposite to the one side of the electronic component 20, the position of the outer side edge 24b of the first bond portion 24 is set so as to match, in the one direction D1, the position of the outer side edge 11b of the first land 11, as in the aforementioned electronic circuit substrate 100 according to the first embodiment.

In addition, with regard to the second bond portions 25 and the second lands 12 on both the one side and the other side of the electronic component 20 of the electronic circuit substrate 200 according to the present embodiment, the outer side edges 25b and the inner side edges 25a of the second bond portions 25 are positioned, in the one direction D1, between the outer side edges 12b and the inner side edges 12a of the second lands 12, as in the aforementioned electronic circuit substrate 100 according to the first embodiment. Moreover, in the electronic circuit substrate 200 according to the present embodiment, in the direction D2 that is orthogonal to the one direction D1 and is along the surface of the printed wiring board 10, the positions of the both side edges 24c and 24d of the first bond portion 24 are set so as to match the positions of the both side edges 11e and 11f of the first land 11, as in the aforementioned electronic circuit substrate 100 according to the first embodiment.

Consequently, with the electronic circuit substrate 200 according to the present embodiment, any excess space is not necessary around the electronic component 20, and position deviation at a time of mounting the electronic component 20 can be prevented, whereby high reliability which is required for the on-vehicle electronic circuit substrate 200, for example, can be ensured, as in the aforementioned electronic circuit substrate 100 according to the first embodiment.

Some of the embodiments according to present invention have been explained so far in detail with use of the drawings, but the specific configuration of the present invention is not limited to these embodiments. Design changes, and the like, made within the scope of the gist of the present invention are encompassed by the present invention.

DESCRIPTION OF REFERENCE CHARACTERS

10: Printed wiring board
11: First land

11a: Inner side edge
11b: Outer side edge
11e: Side edge
11f: Side edge
11g: Projected section
12: Second land
12a: Inner side edge
12b: Outer side edge
20: Electronic component
21: Main body portion
21a: Side edge
22: Heat dissipating portion
23: Lead terminal
24: First bond portion
24a: Inner side edge
24b: Outer side edge
24c: Side edge
24d: Side edge
25: Second bond portion
25a: Inner side edge
25b: Outer side edge
100: Electronic circuit substrate
200: Electronic circuit substrate
D1: One direction
D2: Direction that is orthogonal to one direction
d3: Distance
d4: Distance

The invention claimed is:

1. An electronic circuit substrate comprising: a printed wiring board; and an electronic component which is mounted on a surface of the printed wiring board, wherein
the printed wiring board has a first land and a second land which are arranged in one direction along the surface,
the electronic component has a first bond portion which is bonded to the first land with solder, and a second bond portion which is bonded to the second land with solder,
a bond area of the first land and the first bond portion is larger than a bond area of the second land and the second bond portion,
the first land and the second land have, in the one direction, respective inner side edges which are closed to each other and respective outer side edges which are opposite to the corresponding inner side edges and which are distant from each other,
the first bond portion and the second bond portion have, in the one direction, respective inner side edges which are close to each other and respective outer side edges which are opposite to the corresponding inner side edges and which are distant from each other,
in the one direction, a position of the outer side edge of the first bond portion is set so as to match a position of the outer side edge of the first land, and in a direction that is orthogonal to the one direction and is along the surface of the printed wiring board, positions of both side edges of the first bond portion are set so as to match positions of both side edges of the first land, wherein
the first land has a projected section projected in the one direction from the outer side edge thereof, and a dimension of the projected section in the direction orthogonal to the one direction and a distance between the outer side edge of the second bond portion and the outer side edge of the second land in the one direction are each set as so to be within the minimum range necessary for an inspection of a solder fillet in an automatic optical inspection; and
further comprising: a solder resist formed so as to have a band-like shape in each of the one direction and the direction orthogonal to the one direction on a surface of the first land; and a plurality of thermal vias passing through the first land and the printed wiring board and are open in a region covered with the solder resist, wherein the first bond portion is a surface, of the heat dissipating portion, opposed to a portion excluding the projected section, a region where the solder resist is formed, and openings of the thermal vias, the first bond portion being divided into plurality of regions.

2. The electronic circuit substrate according to claim 1, wherein
in the one direction, the outer side edge and the inner side edge of the second bond portion are positioned between the outer side edge and the inner side edge of the second land.

3. The electronic circuit substrate according to claim 2, wherein
in the one direction, the outer side edge of the first bond portion and the outer side edge of the second bond portion are positioned outside both side edges of a main body portion of the electronic component, and
in the one direction, a distance between the outer side edge of the first bond portion and one side edge of the main body portion is shorter than a distance between the outer side edge of the second bond portion and other side edge of the main body portion.

4. The electronic circuit substrate according to claim 3, wherein
in the one direction, the inner side edge of the first bond portion is positioned inside both side edges of the main body portion, and the inner side edge of the second bond portion is positioned outside the both side edges of the main body portion.

5. The electronic circuit substrate according to claim 2, wherein
in the one direction, the outer side edge and the inner side edge of the first land are positioned inside the both side edges of the main body portion of the electronic component.

6. The electronic circuit substrate according to claim 1, wherein
in the one direction, the second land and the second bond portion are provided on one side of the electronic component.

7. The electronic circuit substrate according to claim 1, wherein
in the one direction, the second land and the second bond portion are provided on each side of the electronic component.

8. The electronic circuit substrate according to claim 1, wherein
the electronic component includes a main body portion, a heat dissipating portion provided to the main body portion, and a lead terminal extending in the one direction from the main body portion,
the first bond portion is on a surface, of the heat dissipating portion, opposed to the first land, and
the second bond portion is an end, of the lead terminal, opposed to the second land.

* * * * *